United States Patent
Ji et al.

(10) Patent No.: US 8,889,515 B2
(45) Date of Patent: Nov. 18, 2014

(54) METHOD FOR FABRICATING SEMICONDUCTOR DEVICE BY CHANGING WORK FUNCTION OF GATE METAL LAYER

(75) Inventors: Yun-Hyuck Ji, Gyeonggi-do (KR); Woo-Young Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 307 days.

(21) Appl. No.: 13/337,443

(22) Filed: Dec. 27, 2011

(65) Prior Publication Data

US 2013/0069166 A1    Mar. 21, 2013

(30) Foreign Application Priority Data

Sep. 15, 2011    (KR) .......................... 10-2011-0092828

(51) Int. Cl.
| | | |
|---|---|---|
| H01L 21/8234 | (2006.01) | |
| H01L 21/336 | (2006.01) | |
| H01L 21/3205 | (2006.01) | |
| H01L 21/4763 | (2006.01) | |
| H01L 21/28 | (2006.01) | |
| H01L 21/265 | (2006.01) | |
| H01L 29/49 | (2006.01) | |
| H01L 29/78 | (2006.01) | |
| H01L 21/8238 | (2006.01) | |
| H01L 21/70 | (2006.01) | |
| H01L 27/088 | (2006.01) | |
| H01L 29/51 | (2006.01) | |

(52) U.S. Cl.
CPC ............ *H01L 21/265* (2013.01); *H01L 29/513* (2013.01); *H01L 21/28088* (2013.01); *H01L 29/4966* (2013.01); *H01L 29/78* (2013.01); *H01L 21/823842* (2013.01)
USPC ........... 438/275; 438/287; 438/591; 257/369; 257/392

(58) Field of Classification Search
None
See application file for complete search history.

(56) References Cited

U.S. PATENT DOCUMENTS

| | | | |
|---|---|---|---|
| 7,510,943 B2* | 3/2009 | Li | ................................. 438/301 |
| 2010/0038725 A1* | 2/2010 | Chudzik et al. | ............... 257/392 |

\* cited by examiner

*Primary Examiner* — Michael Jung
(74) *Attorney, Agent, or Firm* — IP & T Group LLP

(57) ABSTRACT

A semiconductor device includes a substrate including a first region and a second region, a gate dielectric layer formed on the substrate, and a metal electrode layer formed on the gate dielectric layer and including a compound of carbon and nitrogen, wherein a metal electrode formed from the metal electrode layer in the first region has a work function lower than a work function of a metal electrode formed from the metal electrode layer in the second region and a nitrogen concentration of the metal electrode of the first region is smaller than a nitrogen concentration of the metal electrode of the second region.

16 Claims, 9 Drawing Sheets

METHOD FOR FABRICATING SEMICONDUCTOR DEVICE BY CHANGING WORK FUNCTION OF GATE METAL LAYER

CROSS-REFERENCE TO RELATED APPLICATIONS

The present application claims priority of Korean Patent Application No. 10-2011-0092828, filed on Sep. 15, 2011, which is incorporated herein by reference in its entirety.

BACKGROUND

1. Field

Exemplary embodiments of the present invention relate to a semiconductor fabrication technology, and more particularly, to a method for fabricating a semiconductor device employing a metal electrode containing carbon and nitrogen.

2. Description of the Related Art

As a semiconductor device such as a dynamic random access memory (DRAM) gradually operates at a high speed, a P-type metal oxide semiconductor field effect transistor (PMOSFET) and an N-type metal oxide semiconductor field effect transistor (NMOSFET) operating at high speeds are used. To ensure that the NMOSFET and the PMOSFET have proper characteristics while operating at a high speed, a gate electrode of the NMOSFET and a gate electrode of the PMOSFET are to have adequate work functions, respectively. Here, a work function of the gate electrode of the NMOSFET is close to a silicon conduction-band edge energy level and a work function of the gate electrode of the PMOSFET is close to a silicon valence-band edge energy level. In such a case, the channels of the NMOSFET and the PMOSFET may be formed of a surface channel. Thus, the NMOSFET and the PMOSFET may operate at a high speed.

FIG. 1 is a diagram illustrating the structure of a conventional semiconductor device.

Referring to FIG. 1, an isolation layer 12 is formed in a semiconductor substrate 11 to define an NMOSFET region and a PMOSFET region in the semiconductor substrate 11.

A first gate 101 is formed on the NMOSFET region and a second gate 102 is formed on the PMOSFET region. The first gate 101 is obtained by stacking a silicon oxide layer ($SiO_2$) 13A, an $N^+$ polysilicon layer ($N^+$ Poly-Si) 14A, and a tungsten layer (W) 15A. The second gate 102 is obtained by stacking a silicon oxide layer ($SiO_2$) 13B, a $P^+$ polysilicon layer ($P^+$ Poly-Si) 14B, and a tungsten layer (W) 15B.

In the above-mentioned conventional semiconductor device, the silicon oxide layers 13A and 13B used as a gate dielectric layer are grown to have a thickness of 30 Å or less in order to increase a driving current. However, a leakage current value is increased due to a direct tunneling phenomenon. Therefore, off-state characteristics may deteriorate.

Furthermore, in the conventional semiconductor device, in order to form the $N^+$ polysilicon layer 14A and the $P^+$ polysilicon layer 14B, since a polysilicon layer is deposited, a lithography process is performed twice, an ion implantation process is performed, and thus, the fabrication process becomes complicated.

Here, dopant, for example, boron, doped on the $P^+$ polysilicon layer 14B penetrates into the silicon oxide layer 13B serving as a lower gate dielectric layer, resulting in an increase in a leakage current.

Since a gate electrode is formed of a polysilicon layer doped with N type and p type impurities, resistivity is high. Also, since a depletion region is formed in the gate electrode, the operation speed thereof may decrease.

SUMMARY

An embodiment of the present invention is directed to a method for fabricating a semiconductor device, which is capable of preventing a leakage current of a gate dielectric layer and reducing resistivity of a gate electrode.

In accordance with an embodiment of the present invention, a semiconductor device structure includes a substrate including a first region and a second region, a gate dielectric layer formed on the substrate, and a metal electrode layer formed on the gate dielectric layer and including a compound of carbon and nitrogen, wherein a metal electrode formed from the metal electrode layer in the first region has a work function lower than a work function of a metal electrode formed from the metal electrode layer in the second region and a nitrogen concentration of the metal electrode of the first region is smaller than a nitrogen concentration of the metal electrode of the second region.

In accordance with another embodiment of the present invention, a method for fabricating a semiconductor device includes forming a gate dielectric layer on a substrate, forming a metal layer including a compound of carbon and nitrogen on the gate dielectric layer, performing an ion implantation process on the metal layer to reduce a work function of the metal layer, and etching the metal layer and the gate dielectric layer to form a gate.

In accordance with another embodiment of the present invention, a method for fabricating a semiconductor device includes forming a gate dielectric layer on a substrate including a first region and a second region, forming a metal layer including a compound of carbon and nitrogen on the gate dielectric layer, wherein the metal layer has different work functions in the first region and the second region, respectively, and etching the metal layer and the gate dielectric layer to form a first gate and a second gate in the first region and the second region, respectively, wherein a metal electrode formed from the metal layer in the first region has a work function lower than a work function of a metal electrode formed from the metal layer in the second region and a nitrogen concentration of the metal electrode of the first region is smaller than a nitrogen concentration of the metal electrode of the second region.

DETAILED DESCRIPTION

Figure 1:
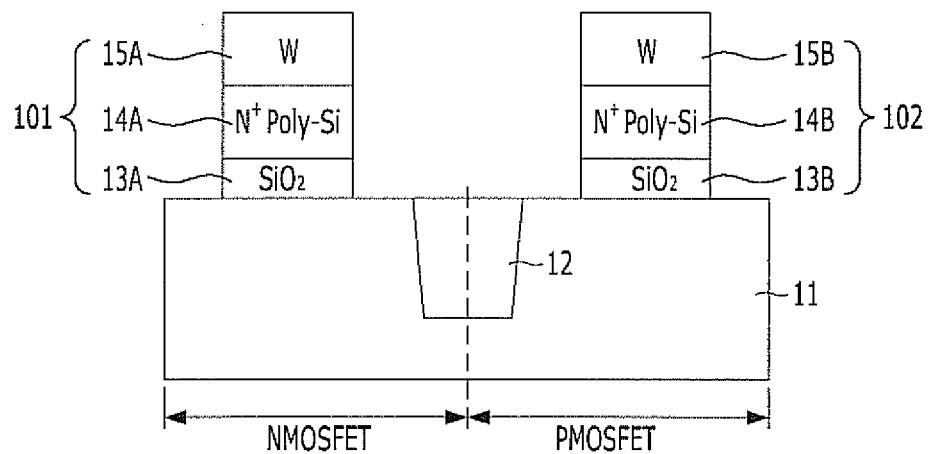
FIG. 1 is a diagram illustrating the structure of a conventional semiconductor device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2A:
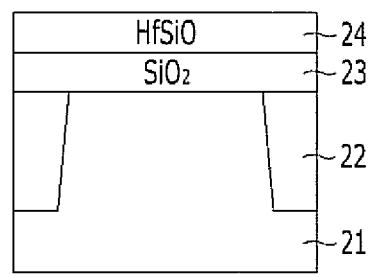
FIGS. 2A and 2E are cross-sectional views illustrating a method for fabricating a semiconductor device in accordance with an embodiment of the present invention.
Figure 2B:
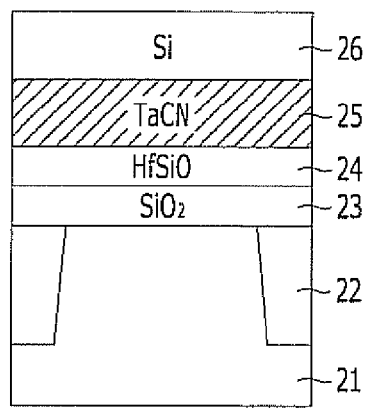
Figure 2C:
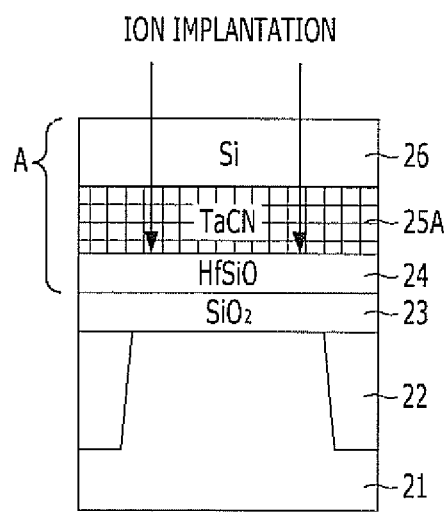
Figure 2D:
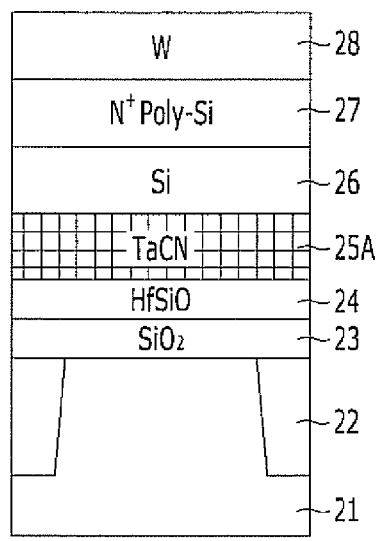
Figure 2E:
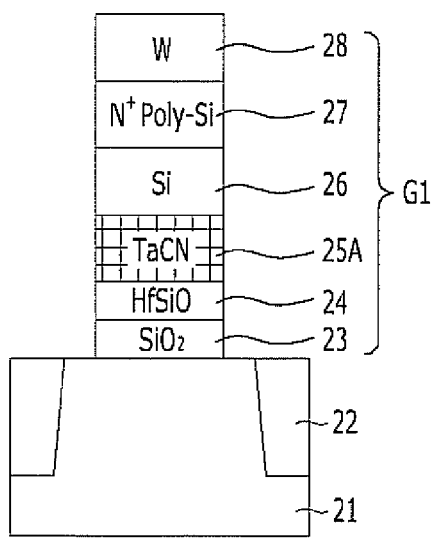
Figure 5:
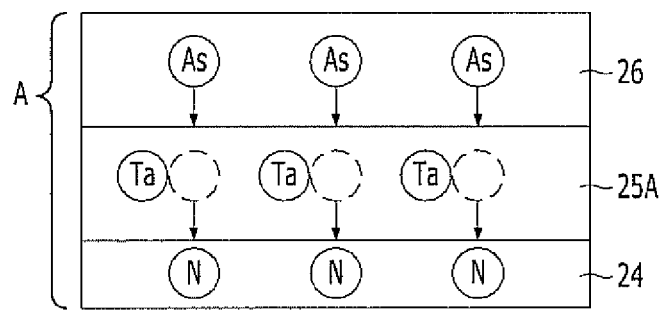
FIG. 5 is a detailed diagram illustrating a change in the state of a region A due to an ion implantation process in FIG. 2C or FIG. 4C.

FIGS. 2A and 2E are cross-sectional views illustrating a method for fabricating a semiconductor device in accordance with an embodiment of the present invention. FIG. 5 is a detailed diagram illustrating a change in the state of a region A due to an ion implantation process in FIG. 2C. For the purpose of illustration, in FIG. 5, the same reference numerals as those of FIG. 2C are used.

Referring to FIG. 2A, an isolation layer 22 is formed in a substrate 21. The substrate 21 is a semiconductor substrate, and according to an example, includes a silicon substrate. The substrate 21 may include a substrate for forming an NMOSFET. The isolation layer 22 may be formed using a shallow trench isolation (STI) process. Although not illustrated in the drawings, when the substrate 21 is an NMOSFET region, a P-type well is further formed in the substrate 21.

An interlayer 23 is formed on the substrate 21. Before the interlayer 23 is formed, a cleaning process is performed to remove a naturally formed oxide layer on the surface of the substrate 21. The cleaning process includes a cleaning process using Hydrogen Fluoride (HF) ion. The HF cleaning process is performed as described above, so that the naturally-formed oxide layer is removed and simultaneously a dangling bond on the surface of the substrate 21 is passivated with hydrogen. In this way, an oxide layer is prevented from being formed before a subsequent process is performed.

The interlayer 23 is formed of an insulating layer, and the insulating layer includes an oxide layer. The oxide layer, for example, includes a silicon oxide layer $SiO_2$. Since the substrate 21 includes a silicon substrate, the interlayer 23 includes a silicon oxide layer grown by oxidizing the surface of the silicon substrate. The interlayer 23 is grown with a thickness of 10 Å. According to an example, the interlayer 23 is grown by a wet oxidation method using $O_3$. The interlayer 23 improves the interfacial characteristics of the substrate to thus improve electron mobility.

A high dielectric constant layer 24 is formed on the interlayer 23, where the high dielectric constant layer 24 has a higher dielectric constant than the interlayer 23. A stack structure of the interlayer 23 and the high dielectric constant layer 24 serves as a gate dielectric layer.

The high dielectric constant layer 24 includes metal silicate. For example, the high dielectric constant layer 24 includes hafnium silicate HfSiO. The hafnium silicate HfSiO is grown with a thickness of 30 Å using metal organic atomic layer deposition (MOALD). According to the metal organic atomic layer deposition (MOALD) for growing the hafnium silicate HfSiO, the hafnium silicate HfSiO is formed through a reaction of tetrakis(ethylmethylamino)hafnium TEMAH, tris(dimethylamino)sylane Tris-DMASiH, and O3, or a reaction of tetrakis(ethylmethylamino)hafnium TEMAH, tris (ethylmethylamino)sylane Tris-EMASiH, and O3 at a temperature of approximately 330° C.

A plasma nitrification process is performed on the high dielectric constant layer 24. The plasma nitrification process is performed for 120 seconds under the conditions of the temperature of 600° C., power of 3 kW, pressure of 1.0 Torr, and Ar and $N_2$ atmosphere. Through the plasma nitrification process, nitrogen penetrates into the hafnium silicate layer so that phase separation of the hafnium silicate is prevented in subsequent high temperature heat treatment.

An annealing process is performed. This is called a post deposition anneal (PDA) process. The annealing process is performed for 60 seconds under the conditions of the temperature of 950° C., pressure of 10 Torr, and $N_2$ atmosphere. Through the annealing process, the hafnium silicate layer is densified (for example, by the act of reducing porosity in a sample to cause the overall volume).

Through the above-mentioned plasma nitrification process and PDA process, a leakage current of the high dielectric constant layer 24 (that is, the hafnium silicate) used as the gate dielectric layer may be minimized/reduced.

Referring to FIG. 2B, a metal layer 25 containing carbon and nitrogen is formed on the high dielectric constant layer 24. The metal layer 25 containing carbon and nitrogen includes a metal layer with a work function varying depending on the content of carbon or nitrogen. For example, the metal layer 25 containing carbon and nitrogen includes a TaCN layer (that is, a compound of Ta, C, and N). For the purpose of illustration, it is assumed that the metal layer 25 containing carbon and nitrogen is a "TaCN layer 25".

The TaCN layer 25 is formed with a thickness of 60 Å using plasma enhanced atomic layer deposition (PEALD). The plasma enhanced atomic layer deposition for forming the TaCN layer 25 is performed through a reaction of tert-buthylimidotrisdiethyl-amidotantalum (TBTDET), $H_2$ and $CH_4$ at a temperature of approximately 300° C.

Since the work function of the TaCN layer 25 is 4.9 eV or more, it may be used as a gate electrode of a PMOSFET region. However, it is difficult to use the TaCN layer 25 as the gate electrode in an NMOSFET region where a work function of 3.7 eV to 4.4 eV is desirable. In this regard, in order to allow the TaCN layer 25 to be used as the gate electrode of the NMOSFET region, a process for performing an ion implantation process on the TaCN layer 25 to reduce a work function thereof is performed. This will be described with reference to FIGS. 2C and 5.

A first silicon layer 26 is formed on the TaCN layer 25. The first silicon layer 26 may be formed with a thickness of 100 Å using low pressure chemical vapor deposition (LPCVD). The low pressure chemical vapor deposition for forming the first silicon layer 26 is performed using, for example, only $SiH_4$ gas or a mixed gas of $SiH_4$ and $PH_3$. The low pressure chemical vapor deposition is performed at a temperature of approximately 530° C. under the pressure of 1.0 Torr.

Referring to FIGS. 2C and 5, in decreasing a work function of the TaCN layer 25, an ion implantation process is performed on a TaCN layer 25A. According to an example, the ion implantation process is performed by applying energy and a dose of ions, by which a covalent bond among carbon, nitrogen and a metal is broken. The ion implantation process may be performed with energy of at least 10 keV or less and a dose of ions at a concentration equal to at least $1.0 \times 10^{16}$ atoms/cm$^2$.

The ion implantation process is performed using arsenic (As) or argon (Ar). Since the arsenic (As) has a large atom size and a large kinetic energy as compared with the argon, bond breakage due to a collision easily occurs. Here, since the arsenic (As) is used as a gate of an MMOSFET, an N-type As may be used for the arsenic used in the ion implantation process. Further, since the argon (Ar) is an inert gas and does not cause a change in the characteristics of a thin film, it can be used to break a bond among carbon, nitrogen and a metal.

As the ion implantation process is performed on the TaCN layer 25A, carbon (C) and nitrogen (N) bonded to the metal are separated, and are diffused out to an exterior or bonded to the metal through subsequent heat treatment. At this time, since the carbon with a relatively high bonding tendency is bonded back to the metal, a concentration of tantalum carbide (TaC) is relatively increased and a work function is reduced as compared with the TaCN layer 25 (refer to FIG. 2B) that is not subjected to the ion implantation process.

The TaCN layer 25A having passed through the ion implantation process has a low work function (3.7 eV to 4.4 eV) suitable for use as the gate electrode of the NMOSFET region. The nitrogen (N) with a broken bond due to the ion implantation process may diffuse out to an exterior through the subsequent heat treatment.

Thus, as compared with the TaCN layer 25 (refer to FIG. 2B) not subjected to the ion implantation process, a work function is relatively reduced so that a TaCN layer 25A having a work function of 3.7 eV to 4.4 eV is formed. Here, while the TaCN layer 25A is illustrated, all carbon and nitrogen-containing metal layers having a work function that varies depending on the content of carbon and nitrogen may also be used for the layer 25A. Here, the ion implantation process may be performed after the first silicon layer 26 is formed as shown or before the formation.

Referring to FIG. 2D, a second silicon layer 27 is formed on the first silicon layer 26 as an anti-reaction layer. The second silicon layer 27 is formed with a thickness of approximately 800 Å at a temperature of 550° C. under the pressure of 1.0 Torr. The second silicon layer 27 is formed through a reaction of $SiH_4$ and $PH_3$. The second silicon layer 27 includes a high concentration N-type impurity. Accordingly, the second silicon layer 27 includes an $N^+$ doped polysilicon layer. The second silicon layer 27 prevents a reaction between the TaCN layer 25A and a tungsten layer 28.

The tungsten layer 28 is formed on the second silicon layer 27 to reduce resistivity of the gate electrode.

Referring to FIG. 2E, a gate mask (not illustrated) is formed through a photolithography process, and a gate etch process is performed.

Thus, a gate G1 is formed on the substrate 21. The gate G1 serves as the gate of the NMOSFET according to the characteristics of the TaCN electrode 25A having passed through the ion implantation process. The gate G1 includes the interlayer 23, the gate dielectric layer 24, and the TaCN electrode 25A having a relatively high composition of TaC and a low work function. The gate G1 further includes the first and second silicon layers 26 and 27, and the tungsten layer 28 which are formed on the TaCN layer 25A.

Figure 3:
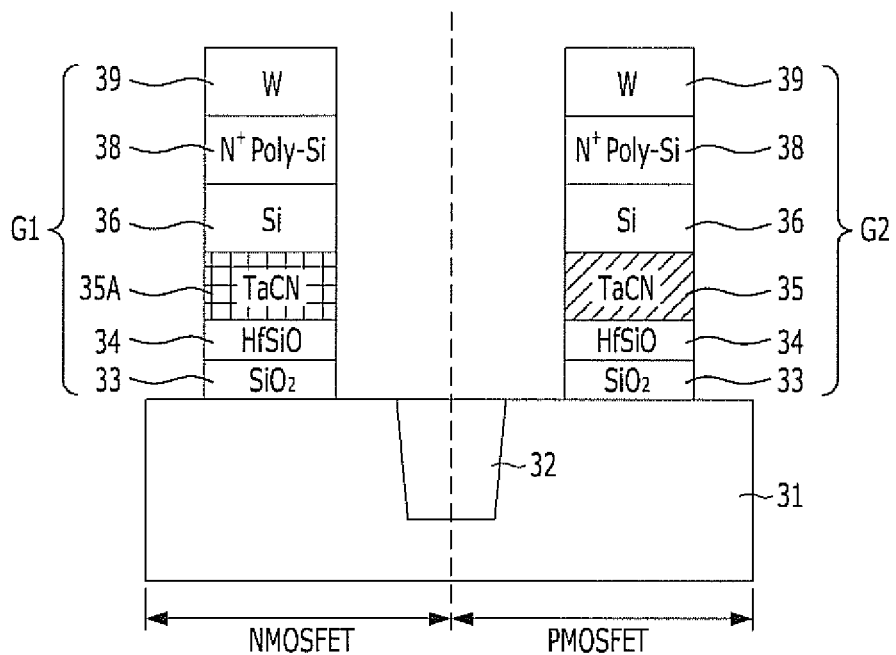
FIG. 3 is a cross-sectional view illustrating a semiconductor device in accordance with an embodiment of the present invention.

FIG. 3 is a cross-sectional view illustrating a semiconductor device in accordance with an embodiment of the present invention.

Referring to FIG. 3, an isolation layer 32 is formed in a substrate 31 including an NMOSFET region and a PMOSFET region. A first gate G1 is formed on the NMOSFET region of the substrate 31 and a second gate G2 is formed on the PMOSFET region of the substrate 31.

The first gate G1 includes an interlayer 33, a gate dielectric layer 34, and a TaCN electrode 35A having a relatively high composition of TaC and a low work function. The TaCN electrode 35A of the first gate G1 has a work function of 3.7 eV to 4.4 eV.

The second gate G2 includes the interlayer 33, the gate dielectric layer 34, and a TaCN electrode 35 having a high work function. The TaCN electrode 35 of the second gate G2 has a work function of 4.7 eV to 5.2 eV.

The first gate G1 and the second gate G2 further include first and second silicon electrodes 36 and 38, and a tungsten layer 39, which are formed on the TaCN electrodes 35A and 35, respectively.

In the present embodiment, the TaCN electrodes 35A and 35 are illustrated. However, in addition to the TaCN electrodes, all carbon and nitrogen-containing metal layers that have a work function varying depending on the content of carbon and nitrogen are included.

A method for forming the TaCN electrodes 35A and 35 having different work functions in the NMOSFET region and the PMOSFET region will be described in detail with reference to FIGS. 4A to 4E. For the purpose of illustration, in FIGS. 4A to 4E, the same reference numerals as those of FIG. 3 are used to refer to the same elements.

Figure 4A:
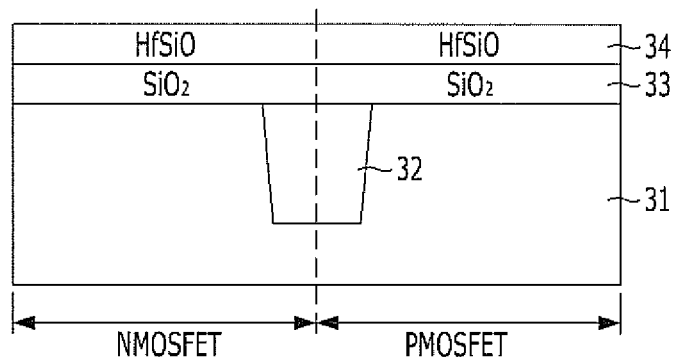
FIGS. 4A and 4E are cross-sectional views illustrating a method for fabricating an NMOSFET and a PMOSFET of a semiconductor device in accordance with an embodiment of the present invention.
Figure 4B:
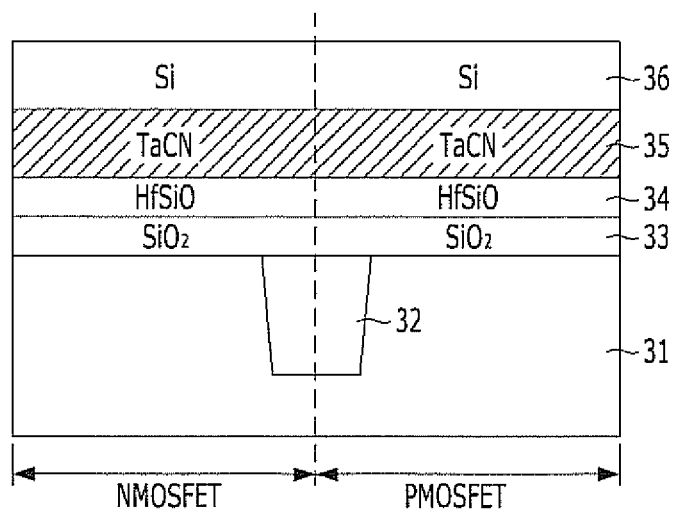
Figure 4C:
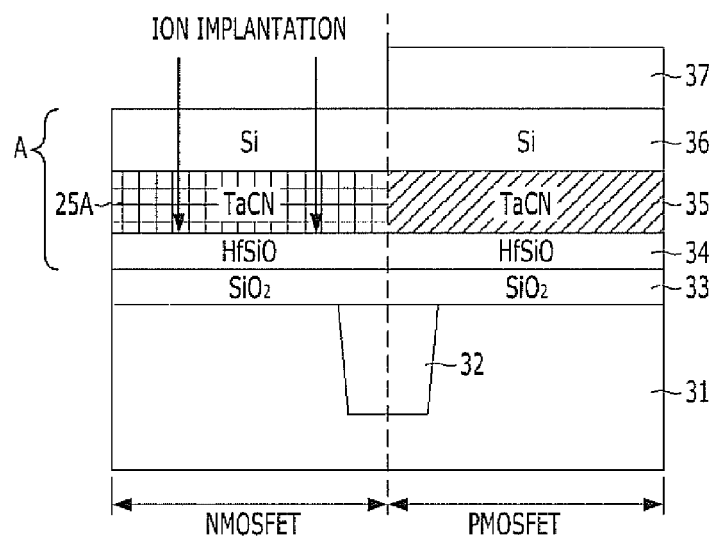
Figure 4D:
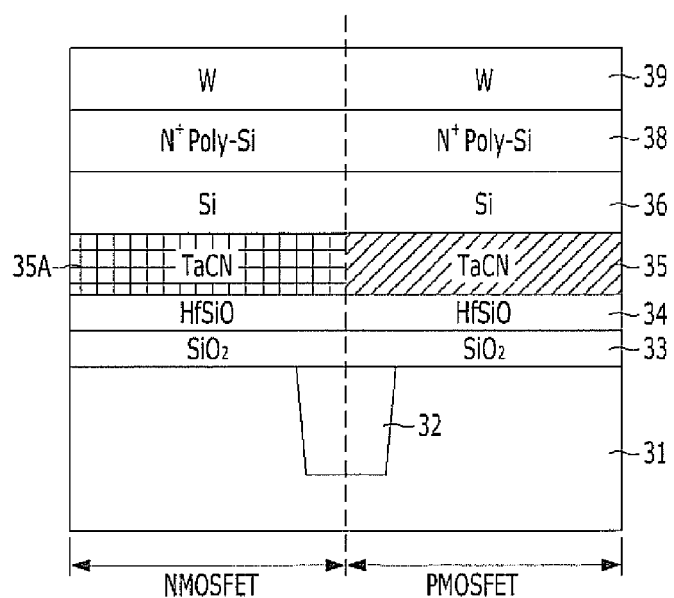
Figure 4E:
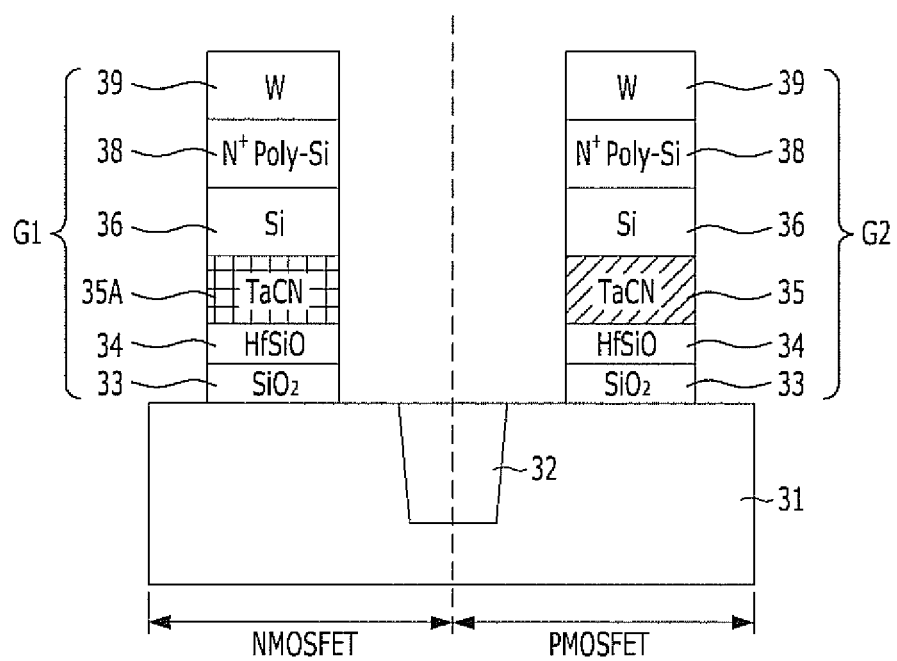

FIGS. 4A and 4E are cross-sectional views illustrating a method for fabricating an NMOSFET and a PMOSFET of a semiconductor device in accordance with an embodiment of the present invention.

Referring to FIG. 4A, an isolation layer 32 is formed in a substrate 31, where a PMOSFET region PMOSFET and an NMOSFET region NMOSFET are defined, to electrically isolate the PMOSFET region from the NMOSFET region. The substrate 31 includes a semiconductor substrate such as a silicon substrate. The isolation layer 32 may be formed using a shallow trench isolation (STI) process. Although not illustrated in the drawings, a P-type well may be further formed in the NMOSFET region and an N-type well may be further formed in the PMOSFET region.

An interlayer 33 is formed on the substrate 31. Before the interlayer 33 is formed, a cleaning process is performed to remove a naturally formed oxide layer on the surface of the substrate 31. The cleaning process includes an HF cleaning process. The HF cleaning process is performed as described above, so that the naturally-formed oxide layer is removed and simultaneously a dangling bond on the surface of the substrate 31 is passivated with hydrogen. In this way, an oxide layer is prevented from being formed before a subsequent process is performed.

The interlayer 33 is formed of an insulating layer, and the insulating layer includes an oxide layer. The oxide layer, for example, includes a silicon oxide layer $SiO_2$. Since the substrate 31 includes a silicon substrate, the interlayer 33 includes a silicon oxide layer grown by oxidizing the surface of the silicon substrate. The interlayer 33 is grown with a thickness of 10 Å. According to an example, the interlayer 33 is grown by a wet oxidation method using $O_3$. The interlayer 33 improves the interfacial characteristics of the substrate to improve electron mobility.

A high dielectric constant layer 34 is formed on the interlayer 33, wherein the high dielectric constant layer 34 has a higher dielectric constant than the interlayer layer 33. A stack structure of the interlayer 33 and the high dielectric constant layer 34 serves as a gate dielectric layer.

The high dielectric constant layer 34 includes metal silicate. For example, the high dielectric constant layer 34 includes hafnium silicate HfSiO. The hafnium silicate HfSiO is grown with a thickness of 30 Å using metal organic atomic layer deposition (MOALD). According to the metal organic atomic layer deposition (MOALD) for growing the hafnium silicate HfSiO, the hafnium silicate HfSiO is formed through a reaction of tetrakis(ethylmethylamino)hafnium TEMAH, tris(dimethylamino)sylane Tris-DMASiH, and O3, or a reaction of tetrakis(ethylmethylamino)hafnium TEMAH, tris (ethylmethylamino)sylane Tris-EMASiH, and O3 at a temperature of approximately 330° C.

A plasma nitrification process is performed on the high dielectric constant layer 34. The plasma nitrification process is performed for 120 seconds under the conditions of the temperature of 600° C., power of 3 kW, pressure of 1.0 Torr, and Ar and $N_2$ atmosphere. Through the plasma nitrification process, nitrogen penetrates into the hafnium silicate layer so that phase separation of the hafnium silicate is prevented in subsequent high temperature heat treatment.

An annealing process is performed. This is called a post deposition anneal (PDA) process. The annealing process is performed for 60 seconds under the conditions of the temperature of 950° C., pressure of 10 Torr, and $N_2$ atmosphere. Through the annealing process, the hafnium silicate layer is densified.

Through the above-mentioned plasma nitrification process and PDA process, a leakage current of the high dielectric constant layer 34 (that is, the hafnium silicate) used as the gate dielectric layer may be minimized/reduced.

Referring to FIG. 4B, a metal layer 35 containing carbon and nitrogen is formed on the high dielectric constant layer 34. The metal layer 35 containing carbon and nitrogen includes a metal layer with a work function varying depending on the content of carbon or nitrogen. For example, the metal layer 35 containing carbon and nitrogen includes a TaCN layer. For the purpose of illustration, it is assumed that the metal layer 35 containing carbon and nitrogen is a "TaCN layer 35".

The TaCN layer 35 is formed with a thickness of 60 Å using plasma enhanced atomic layer deposition (PEALD). The plasma enhanced atomic layer deposition for forming the TaCN layer 35 is performed through a reaction of TBTDET, $H_2$ and $CH_4$ at a temperature of approximately 300° C.

Since the work function of the TaCN layer 35 is 4.9 eV or more, it may be used as a gate electrode of the PMOSFET region. However, it is difficult to use the TaCN layer 35 as the gate electrode in the NMOSFET region where a work function of 3.7 eV to 4.4 eV is desirable. In this regard, in order to allow the TaCN layer 35 to be used as the gate electrode of the NMOSFET region, a process for performing an ion implantation process on the TaCN layer 35 to reduce a work function thereof is performed. This will be described with reference to FIG. 4C.

A first silicon layer 36 is formed on the TaCN layer 35. The first silicon layer 36 may be formed with a thickness of 100 Å using low pressure chemical vapor deposition (LPCVD). The low pressure chemical vapor deposition for forming the first silicon layer 36 is performed using, for example, only $SiH_4$ gas or a mixed gas of $SiH_4$ and $PH_3$. The low pressure chemical vapor deposition is performed at a temperature of approximately 530° C. under the pressure of 1.0 Torr.

Referring to FIG. 4C, a mask pattern 37 is formed on the first silicon layer 36 of the PMOSFET region to open the first silicon layer 36 of the NMOSFET region. The mask pattern 37 is formed by coating a photoresist layer on the first silicon layer 36 and patterning the photoresist layer through an exposure and development process such that the first silicon layer 36 of the NMOSFET region is opened.

In decreasing a work function of the TaCN layer 35 in the NMOSFET region, which is not covered by the mask pattern, an ion implantation process is performed on a TaCN layer 35A of the NMOSFET region using the mask pattern 37 as an ion implantation barrier. According to an example, the ion implantation process is performed by applying energy and a dose of ions, by which a covalent bond among carbon, nitrogen and a metal is broken. The ion implantation process may be performed with an energy of at least 10 keV or less and a dose of ions at a concentration equal to at least $1.0 \times 10^{16}$ atoms/$cm^2$.

The ion implantation process is performed using arsenic (As) or argon (Ar). Since the arsenic (As) has a large atom size and a large kinetic energy as compared with the argon, bond breakage due to a collision easily occurs. Here, since the arsenic (As) is used as a gate of an MMOSFET, an N-type As may be used for the arsenic used in the ion implantation process. Further, since the argon (Ar) is an inert gas and does not cause a change in the characteristics of a thin film, it can be used to break a bond among carbon, nitrogen and a metal.

As the ion implantation process is performed on the TaCN layer 35A, carbon (C) and nitrogen (N) bonded to the metal are separated, and are diffused out to an exterior or bonded to the metal through subsequent heat treatment. At this time, since the carbon with a relatively high bonding tendency is bonded back to the metal, a concentration of TaC is relatively increased and a work function is reduced as compared with the TaCN layer 35 of the PMOSFET region that is not subjected to the ion implantation process.

The TaCN layer 35A of the NMOSFET region having passed through the ion implantation process has a low work function (3.7 eV to 4.4 eV) suitable for use as the gate electrode of the NMOSFET. The nitrogen (N) with a broken bond due to the ion implantation process may be diffused out to an exterior through the subsequent heat treatment.

Thus, the TaCN layer 35 of the PMOSFET region shielded from the ion implantation process has a work function of 4.4 eV to 5.2 eV, and the TaCN layer 35A of the NMOSFET region unshielded from the ion implantation process has a relatively low work function, so that a TaCN layer 35A having a work function of 3.7 eV to 4.4 eV is formed in the NMOSFET region.

Referring to FIG. 4D, the mask pattern 37 (refer to FIG. 4C) is removed and a cleaning process is performed. The mask pattern may be removed by a dry etching process such as an oxygen strip process.

A second silicon layer 38 is formed on the first silicon layer 36 as an anti-reaction layer. The second silicon layer 38 is formed with a thickness of approximately 800 Å at a temperature of 550° C. under the pressure of 1.0 Torr. The second silicon layer 38 is formed through a reaction of $SiH_4$ and $PH_3$. The second silicon layer 38 includes a high concentration N-type impurity. Accordingly, the second silicon layer 38 includes an $N^+$ doped polysilicon layer. The second silicon layer 38 prevents a reaction between the TaCN layers 35 and 35A and a tungsten layer 39.

The tungsten layer 39 is formed on the second silicon layer 38 to reduce resistivity of the gate electrode.

Referring to FIG. 4E, a gate mask (not illustrated) is formed through a photolithography process, and a gate etch process is performed.

Thus, a first gate G1 is formed on the NMOSFET region of the substrate and a second gate G2 is formed on the PMOSFET region. The first gate G1 serves as the gate of the NMOSFET and the second gate G2 serves as the gate of the PMOSFET. The first gate G1 includes the interlayer 33, the gate dielectric layer 34, and the TaCN electrode 35A having a relatively high composition of TaC and a low work function. The second gate G2 includes the interlayer 33, the gate dielectric layer 34, and the TaCN electrode 35 having a high work function. The first gate G1 and the second gate G2 further include the first and second silicon layers 36 and 38, and the tungsten layer 39, which are formed on the TaCN layers 35A and 35, respectively.

FIG. 5 is a detailed diagram illustrating a change in the state of a region A due to an ion implantation process in FIG. 2C or FIG. 4C, where N is broken off from TaCN and is diffused out of the TaCN layer 25 to thus form TaCN layer 25A with a higher concentration of TaC composition.

Figure 6:
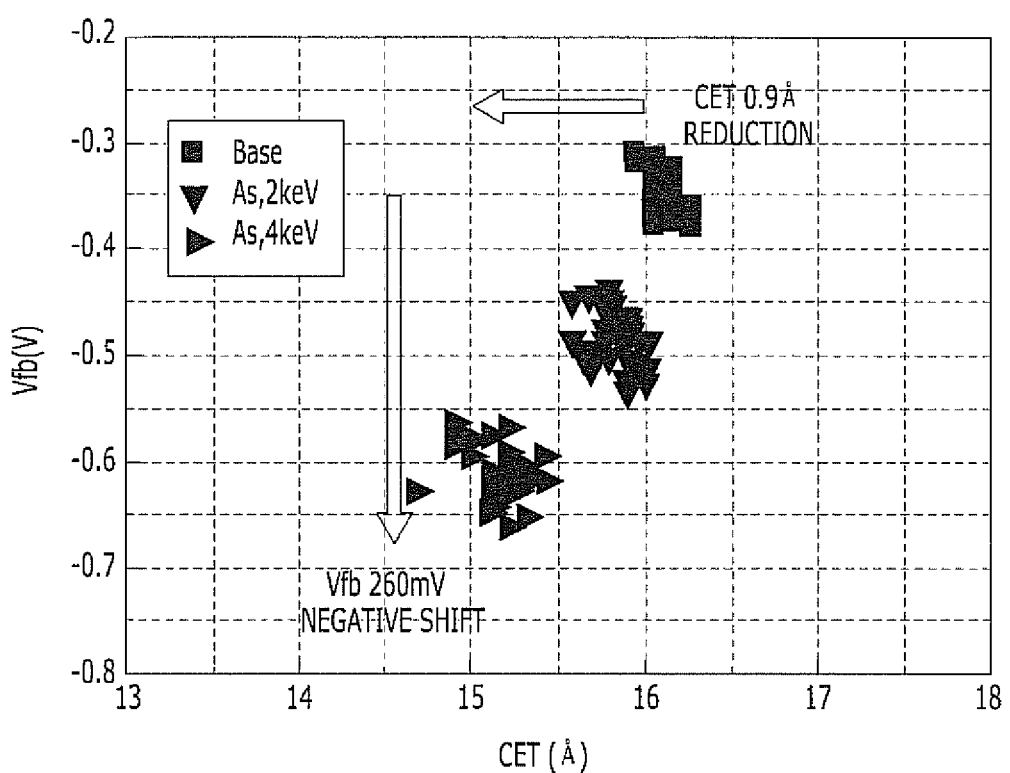
FIG. 6 is a graph illustrating a change in a flat band voltage Vfb and a capacitance equivalent thickness CET due to an ion implantation process.

FIG. 6 is a graph illustrating a change in a flat band voltage Vfb and a capacitance equivalent thickness (CET) due to an ion implantation process.

Referring to FIG. 6, a TaCN layer that has not been subjected to an ion implantation process, a TaCN layer including arsenic (As) implanted with an energy of 2 keV, and a TaCN layer including arsenic (As) implanted with an energy of 4 keV may be compared with one another in terms of the flat band voltage Vfb and the capacitance equivalent thickness CET. For convenience, a comparison result is expressed by Table 1 below.

TABLE 1

|  | Vfb (V) | ΔVfb (V) | CET (Å) | ΔCET (Å) |
| --- | --- | --- | --- | --- |
| Base | −0.352 |  | 16.1 |  |
| As, 2 keV | −0.485 | −0.133 | 15.8 | −0.3 |
| As, 4 keV | −0.612 | −0.261 | 15.2 | −0.9 |

In Table 1 above, it can be understood that the TaCN layer that has not been subjected to the ion implantation process has a flat band voltage Vfb of −0.352 but increases to −0.485 V and −0.612 V as the ion implantation energy of the arsenic (As) is increased. That is, it can be understood that the amplitude of an applied voltage is increased when the ion implantation process is performed with a large energy, and thus a difference between work functions is increased.

Furthermore, the capacitance equivalent thickness CET of the gate dielectric layer is 16.1 Å in the case of the TaCN layer that has not been subject to the ion implantation process, but gradually decreases to 15.8 Å and 15.2 Å as the ion implantation energy is increased.

While the exemplary embodiments of the present embodiment have been described in relation to the TaCN layer, different carbon and nitrogen-containing metal layers that have a work function varying depending on the concentration of carbon and nitrogen may be used.

According to the exemplary method for fabricating the semiconductor device in accordance with the exemplary embodiment of the present invention as described above, a metal silicate having a high dielectric constant is employed as a gate dielectric layer to improve an off-state characteristic through leakage current suppression, thereby reducing a power consumption amount.

Furthermore, a carbon and nitrogen-containing metal layer is employed as a gate electrode, thereby preventing a depletion phenomenon, an increase in a leakage current and resistivity, and the like due to the application of a polysilicon electrode.

Moreover, a work function of a carbon and nitrogen-containing metal layer is adjusted through an ion implantation process, thereby forming a gate electrode suitable for an NMOSFET as well as a PMOSFET.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming a gate dielectric layer on a substrate;
    forming a metal layer including a compound of carbon and nitrogen on the gate dielectric layer;
    breaking a bond among carbon, nitrogen and/or metal included in the metal layer through an ion implantation process on the metal layer;
    after the breaking of the bond, forming a second silicon layer and a tungsten layer on the metal layer; and
    etching the tungsten layer, the second silicon layer, the metal layer and the gate dielectric layer to form a gate.

2. The method of claim 1, wherein the substrate is a region where an NMOSFET is formed and the gate serves as a gate of the NMOSFET.

3. The method of claim 1, wherein, after the breaking of the bond, the metal layer has a work function of approximately 3.7 eV to approximately 4.4 eV.

4. The method of claim 1, wherein the ion implantation process is performed using arsenic (As) or Argon (Ar).

5. The method of claim 1, wherein the metal electrode includes a tantalum carbon nitride (TaCN) layer.

6. The method of claim 1, wherein the gate dielectric layer includes a stack structure of a silicon oxide layer and a dielectric layer.

7. The method of claim 6, wherein the dielectric layer has a higher dielectric constant than the silicon oxide layer.

8. The method of claim 6, wherein the dielectric layer includes hafnium silicate (HfSiO).

9. The method of claim 1, further comprising:
    forming a first silicon layer on the metal layer before the decreasing of the work function.

10. A method for fabricating a semiconductor device, comprising:
    forming a gate dielectric layer on a substrate including a first region and a second region;
    forming a metal layer including a compound of carbon and nitrogen on the gate dielectric layer, wherein the metal layer has different work functions in the first region and the second region, respectively; and
    etching the metal layer and the gate dielectric layer to form a first gate and a second gate in the first region and the second region, respectively,
    wherein a metal electrode formed from the metal layer in the first region has a work function lower than a work function of a metal electrode formed from the metal layer in the second region and a nitrogen concentration of the metal electrode of the first region is smaller than a nitrogen concentration of the metal electrode of the second region,
    wherein the first region is a region where an NMOSFET is formed and the first gate serves as a gate of the NMOSFET, and
    wherein the second region is a region where a PMOSFET is formed and the second gate serves as a gate of the PMOSFET.

11. The method of claim 10, wherein the gate dielectric layer includes a stack structure of a silicon oxide layer and a dielectric layer.

12. The method of claim 11, wherein the dielectric layer includes hafnium silicate (HfSiO).

13. The method of claim 10, wherein the metal layer includes a TaCN layer.

14. The method of claim 10, wherein the forming of the metal layer having different work functions comprises:
   forming a first metal layer including a compound of carbon and nitrogen on the gate dielectric layer; and
   performing an ion implantation process on the first metal layer of the first region.

15. The method of claim 14, further comprising: forming a silicon layer on metal layers of the first region and the second region.

16. The method of claim 14, wherein the performing of the ion implantation process is performed using arsenic (As) or Argon (Ar).

* * * * *